United States Patent
Jindal et al.

(10) Patent No.: US 11,236,415 B2
(45) Date of Patent: Feb. 1, 2022

(54) DEPOSITION SYSTEM WITH SHIELD MOUNT

(71) Applicant: Applied Materials, Inc., Santa Clara, CA (US)

(72) Inventors: Vibhu Jindal, Milpitas, CA (US); Sanjay Bhat, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 16/444,570

(22) Filed: Jun. 18, 2019

(65) Prior Publication Data

US 2019/0382879 A1    Dec. 19, 2019

Related U.S. Application Data (60) Provisional application No. 62/687,232, filed on Jun. 19, 2018.

(51) Int. Cl.
  *C23C 14/04* (2006.01)
  *C23C 14/34* (2006.01)
  *C23C 14/14* (2006.01)

(52) U.S. Cl.
  CPC ............ *C23C 14/042* (2013.01); *C23C 14/14* (2013.01); *C23C 14/3464* (2013.01)

(58) Field of Classification Search
  CPC ... C23C 14/042; C23C 14/3464; C23C 14/14; C23C 14/352; H01J 37/3447; H01J 37/3441
  See application file for complete search history.

(56) References Cited

U.S. PATENT DOCUMENTS

| | | | | |
|---|---|---|---|---|
| 4,410,407 A | * | 10/1983 | Macaulay | C23C 14/564 204/192.25 |
| 5,749,028 A | * | 5/1998 | Damji | F16C 17/24 399/117 |
| 5,876,573 A | * | 3/1999 | Moslehi | C23C 14/3407 204/192.12 |
| 2012/0049871 A1 | * | 3/2012 | Raj | F16J 15/43 324/722 |
| 2013/0101447 A1 | * | 4/2013 | Brown | F04B 17/03 417/410.1 |
| 2014/0272684 A1 | | 9/2014 | Hofmann et al. | |
| 2015/0122643 A1 | * | 5/2015 | Xie | H01J 37/347 204/298.14 |
| 2015/0279635 A1 | * | 10/2015 | Subramani | H01J 37/3447 204/192.15 |
| 2015/0286129 A1 | * | 10/2015 | Tricard | H05G 2/001 250/492.22 |

OTHER PUBLICATIONS

PCT international Search Report and Written Opinion in PCT/US2019/037875 dated Oct. 1, 2019, 13 pages.

* cited by examiner

*Primary Examiner* — James Lin
*Assistant Examiner* — Patrick S Ott
(74) *Attorney, Agent, or Firm* — Servilla Whitney LLC (57) ABSTRACT

A deposition system and a method of operation thereof are disclosed. A PVD chamber is disclosed comprising a plurality of cathode assemblies, a rotating shield below the plurality of cathode assemblies to expose one of the plurality cathode assemblies through the shroud and through a shield hole of the shield, the shield comprising a top surface including a raised peripheral frame. A shield mount sized and shaped to engage with the raised peripheral frame to secure the shield mount to the shield.

20 Claims, 12 Drawing Sheets

DEPOSITION SYSTEM WITH SHIELD MOUNT

CROSS-REFERENCE TO RELATED APPLICATIONS

This application claims priority to U.S. Provisional Application No. 62/687,232, filed Jun. 19, 2018, the entire disclosure of which is hereby incorporated by reference herein.

TECHNICAL FIELD

The present disclosure relates generally to substrate processing systems, and more specifically, to deposition systems with multiple cathode assemblies (multi-cathodes) having a shield mount for a rotating shield.

BACKGROUND

Sputtering, alternatively called physical vapor deposition (PVD), has long been used for the deposition of metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively affect the properties of the final product.

Plasma sputtering may be accomplished using either DC sputtering or RF sputtering. Plasma sputtering typically includes a magnetron positioned at the back of the sputtering target including two magnets of opposing poles magnetically coupled at their back through a magnetic yoke to project a magnetic field into the processing space to increase the density of the plasma and enhance the sputtering rate from a front face of the target. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC power can produce high energy at a sputtering target, and cause a large rise in surface temperature of the sputtering target. The sputtering target is cooled by contacting a target backing plate with cooling fluid. In plasma sputtering as typically practiced commercially, a target of the material to be sputter deposited is sealed to a vacuum chamber containing the wafer to be coated. Argon is admitted to the chamber. When a negative DC bias of several hundred volts is applied to target while the chamber walls or shields remain grounded, the argon is excited into a plasma. The positively charged argon ions are attracted to the negatively biased target at high energy and sputter target atoms from the target.

During deposition in a PVD chamber with multiple cathode assemblies, a rotating shield is utilized to expose one of the cathode assemblies at a time and protect other cathode assemblies from cross-contamination. Current shield designs do not uniformly hold the weight of the shield, especially for larger shields, which results in vibrations, reduced process control and defects generated during deposition. Thus, there is a need for deposition systems that include a mounting assembly that securely holds the weight of the shield, reduces vibrations and prevents generation of defects during deposition.

SUMMARY

According to one embodiment of the disclosure, a physical vapor deposition (PVD) chamber comprises a plurality of cathode assemblies; a rotating shield below the plurality of cathode assemblies to expose one of the plurality of cathode assemblies through a shield hole of the rotating shield, the rotating shield comprising a top surface including a raised peripheral frame; and a shield mount sized and shaped to engage with the raised peripheral frame to secure the shield mount to the shield.

In another embodiment, a physical vapor deposition (PVD) chamber comprises a plurality of cathode assemblies; a rotating shield below the plurality of cathode assemblies to expose one of the plurality cathode assemblies through a shield hole of the rotating shield, the rotating shield comprising a top surface including a raised peripheral frame; a shield mount sized and shaped to engage with the raised peripheral frame to secure the shield mount to the shield; a collet secured to the shield mount; and a shield motor shaft secured to the collet and secured to a motor that rotates the shield motor shaft and the shield.

Another embodiment pertains to a method of depositing a material layer comprising placing a substrate in a PVD chamber; rotating a shield below the plurality of cathode assemblies to expose one of the plurality cathode assemblies through a shield hole of the shield, the shield comprising a top surface including a raised peripheral frame, the shield secured to a shield mount sized and shaped to engage with the raised peripheral frame on the shield to secure the shield mount to the shield; and depositing the material layer on the substrate.

Certain embodiments of the disclosure have other features or elements in addition to or in place of those mentioned above.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure pertain to a magnet design for a deposition system, for example a physical vapor deposition ("PVD") chamber comprising at least one cathode assembly, and in particular embodiments, a PVD chamber comprising multiple cathode assemblies (referred to herein as a "multi-cathode chamber).

Figure 1:
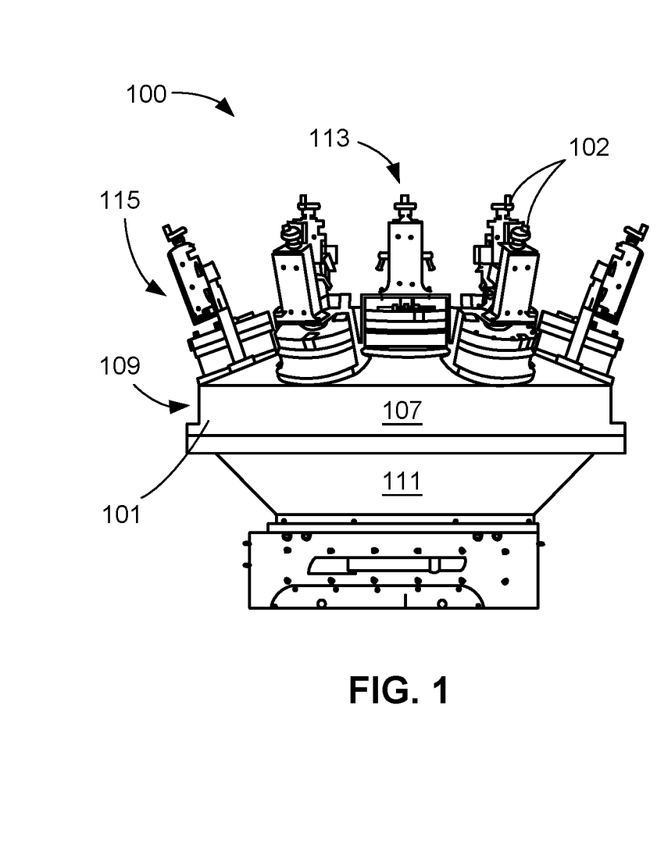
FIG. 1 is a side view of a deposition system according to an embodiment of the disclosure.

Referring now to FIG. 1, a side view of a portion of a deposition system in the form of a PVD chamber 100 is shown. The deposition system in the form of a PVD chamber in some embodiments is a multi-cathode PVD chamber 100 including a plurality of cathode assemblies 102. The multi-cathode PVD chamber 100 includes a multi-target PVD source configured to manufacture an MRAM (magnetoresistive random access memory) or a multi-target PVD source configured to manufacture an extreme ultraviolet (EUV) mask blank.

The multi-cathode PVD chamber comprises a chamber body 101, comprising a source adapter 107 configured to hold multiple cathode assemblies 102 in place in a spaced apart relationship. While the chamber body 101 is shown as being generally cylindrical and having the source adapter 107 having a dome portion 109 that is angled to provide a raised dome, the PVD chamber 100 of the present disclosure is not limited to the configuration shown. For example, the dome portion 109 does not have to be angled, and the dome portion has a profile that is generally flat. Furthermore, the chamber body can be shapes other than cylindrical, including elliptical, square or rectangular. The source adapter 107 holds any number of the cathode assemblies 102. As a specific example, the source adapter 107 supports twelve cathode assemblies 102. However, in some embodiments, the source adapter 107 supports one, two, three, four, five, six, seven, eight, nine, ten, eleven, twelve, thirteen, fourteen, fifteen, sixteen, seventeen, eighteen, nineteen or twenty cathode assemblies 102.

The source adapter 107 in some embodiments is mounted onto a base adapter 111, which is conical, cylindrical or any other shape such as square or rectangular. Both the source adapter 107 and the base adapter 111 enclose an inner volume 119 (shown in FIG. 3) which is an area where a substrate or carrier 108 is processed according to one or more embodiments.

The multi-cathode PVD chamber 100 includes multiple cathode assemblies 102 for PVD and sputtering. Each of the cathode assemblies 102 is connected to a power supply 112 (shown in FIG. 3) including direct current (DC) or radio frequency (RF). The cathode assemblies 102 have any number of different diameters. In some embodiments, the cathode assemblies 102 all have the same diameter. In other embodiments, the cathode assemblies 102 have two, three, four, five, six or more different diameters.

Figure 2:
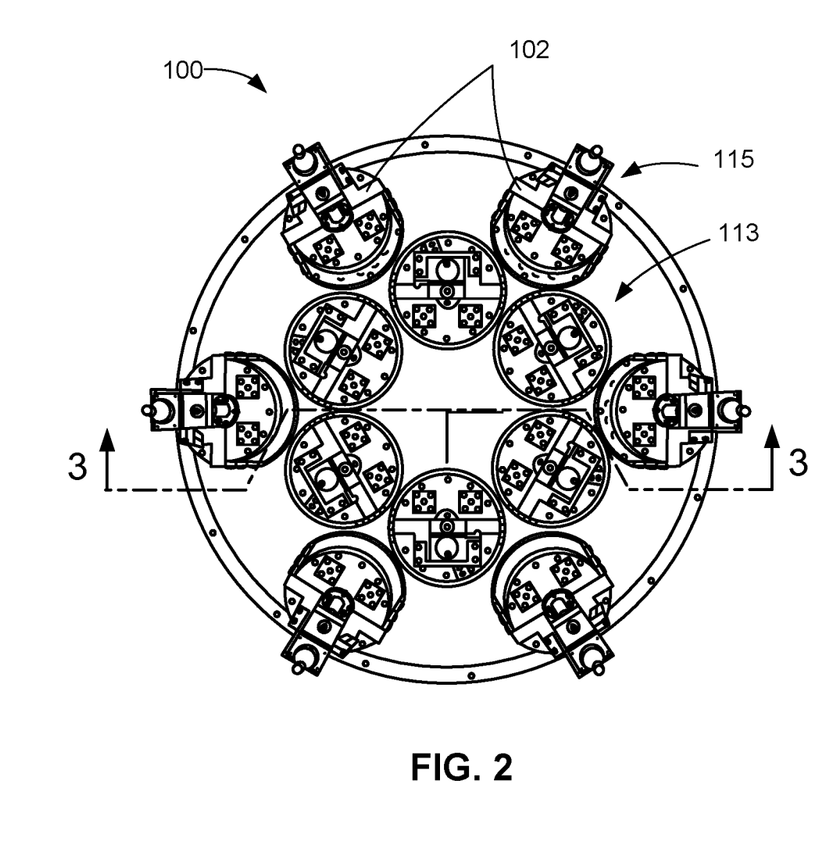
FIG. 2 is a top view of a portion of the deposition system shown in FIG. 1.

As shown in FIGS. 1 and 2, the cathode assemblies 102 are arranged in an inner ring 113 and an outer ring 115. These rings (inner ring 113 and outer ring 115) are also called races. All of the cathode assemblies 102 can be arranged in a single ring instead of the inner ring 113, and the outer ring 115 shown. In one or more embodiments, the configuration in which there is the inner ring 113 and the outer ring 115 achieves a high level of uniformity of deposition without rotating the carrier 108 shown in FIG. 3.

Figure 3:
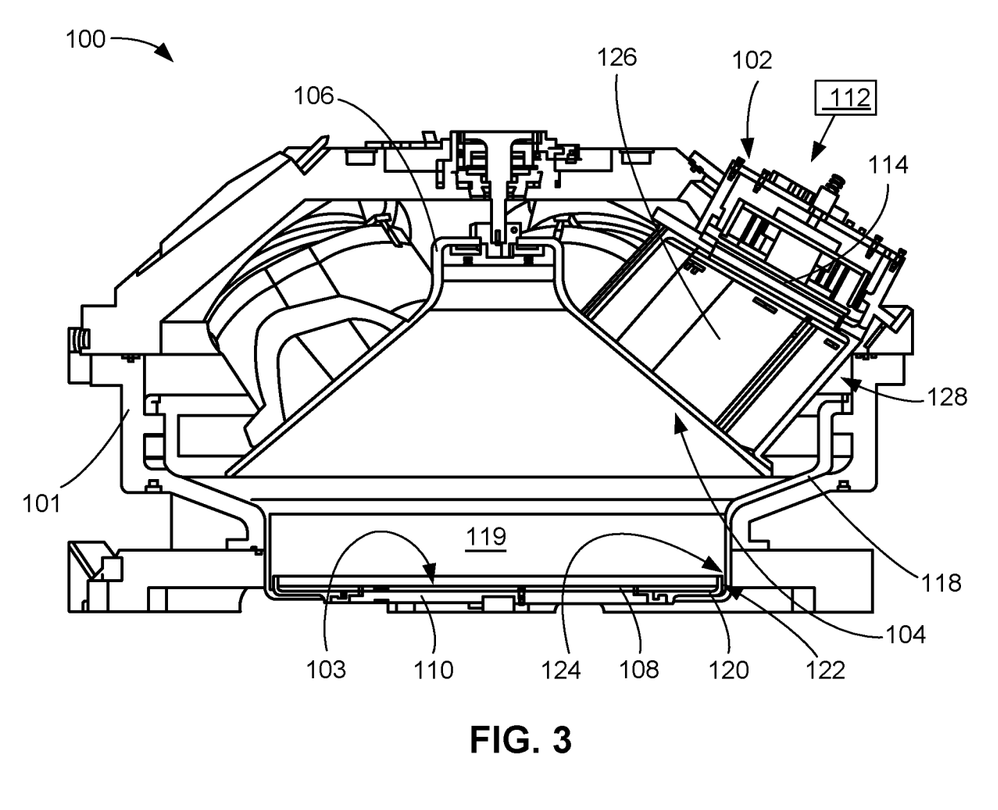
FIG. 3 is a cross-sectional view of a deposition system 100 taken along line 3-3 of FIG. 2.

Referring now to FIG. 3, a cross-sectional view of a deposition system in the form of the PVD chamber 100 is shown, taken along line 3-3 of FIG. 2 according to an embodiment of the present disclosure. The cross-sectional view depicts an example of a PVD chamber 100 including the chamber body 101 defining an inner volume 119, where a substrate or carrier is processed.

The cathode assemblies 102 in the embodiment shown in FIGS. 1-3 are used for sputtering different materials as a material layer 103. The cathode assemblies 102 exposed through shield holes 104 of a rotating shield 106, which are over the substrate or carrier 108 on a rotating pedestal 110. There may be only one carrier 108 over or on the rotating pedestal 110.

The substrate or carrier 108 is in one embodiment, a structure having a semiconductor material used for fabrication of integrated circuits. For example, the substrate or carrier 108 according to some embodiments comprises a semiconductor structure including a wafer. Alternatively, the carrier is another material, such as an ultra low expansion glass substrate used to form an EUV mask blank. The substrate or carrier 108 are any suitable shape such as round, square, rectangular or any other polygonal shape. The rotating shield 106 is formed with the shield holes 104 so that the cathode assemblies 102 are used to deposit the material layers 103 through the shield holes 104.

A power supply 112 is applied to the cathode assemblies 102. The power supply 112 in some embodiments includes a direct current (DC) or radio frequency (RF) power supply. In some embodiments, such as the embodiment shown in FIGS. 1-3, angular positions of the cathode assemblies 102 are changed to any desired angle. This design allows coaxial feed for power, such as the power supply 112, to the cathode assemblies 102.

The rotating shield 106 exposes one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber can be compact. The targets 114 are any suitable size. For example, each of the targets 114 are a diameter in a range of from about 4 inches to about 20 inches, or from about 4 inches to about 15 inches, or from about 4 inches to about 10 inches, or from about 4 inches to about 8 inches or from about 4 inches to about 6 inches.

According to some embodiments, the rotating pedestal 110 allows for the use of a variety of different materials in one chamber. Features of the multi-cathode PVD chamber 100 include a single rotating shield, such as the rotating shield 106, without rotating components hidden behind the rotating shield 106. In some embodiments, the rotating shield 106 provides an advantage of improving particle performance.

In FIG. 3, the substrate or carrier 108 is on the rotating pedestal 110, which can vertically move up and down. Before the substrate or carrier 108 moves out of the chamber, the substrate or carrier 108 moves below a lower shield 118. A telescopic cover ring 120 is shown as a structure that abuts the lower shield 118. Then, the rotating pedestal 110 moves down, and then the carrier 108 is lifted up with a robotic arm before the carrier 108 moves out of the chamber.

When the material layers 103 are sputtered, the materials sputtered from the targets 114 are retained inside and not outside of the lower shield 118. Telescopic cover ring 120 in some embodiments includes a raised ring portion 122 that curves up and has a predefined thickness. The telescopic cover ring 120 also includes a predefined gap 124 and a predefined length with respect to the lower shield 118. Thus, the materials that form material layers 103 will not be below the rotating pedestal 110 thereby eliminating contaminants from spreading to the carrier 108.

FIG. 3 depicts individual shrouds 126. The shrouds 126 are designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects. For example, the majority includes at least 80% of one of the materials.

The shrouds 126 are designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not land on the substrate or carrier 108.

The substrate or carrier 108 in some embodiments are coated with uniform material layer 103 deposited on a surface of the substrate or carrier 108 using the deposition materials including a metal from the targets 114 over the shrouds 126. Then, the shrouds 126 are taken through a recovery process. The recovery process not only cleans the shrouds 126 but also recovers a residual amount of the deposition materials remained on or in the shrouds 126. The uniformity of the material layer 103 relates to how evenly or smoothly the materials are deposited at a predetermined number of locations on the surface of the substrate or carrier 108.

For example, there may be platinum on one of the shrouds 126 and then iron on another of the shrouds 126. Since platinum is a precious metal that is more valuable than iron, the shrouds 126 with platinum are sent out for the recovery process. In one or more embodiments, rotating the rotating shield 106 to expose each of the cathode assemblies 102 through the shroud 126 and one of the shield holes 104 improves reliability without the cross-contamination between the cathode assemblies 102. In some embodiments, rotating the rotating pedestal 110 improves the uniformity of the material layer 103 deposited from the targets 114.

According to one or more embodiments, by varying the power to the cathode assemblies 102, the amount of material deposited and the thickness of the material layer 103 can be varied. In some embodiments, varying the power controls the uniformity of the material layer 103. In some embodiments, better uniformity is further be achieved by controlling the rotating pedestal 110. Each of the cathode assemblies 102 applies different materials to form material layers 103 having different compositions. For example, a first cathode assembly and a second cathode assembly apply alternating layers of different materials in the formation of an extreme ultraviolet mask blank, for example, alternating layers of silicon deposited from a first target and cathode assembly 102 and molybdenum from a second target and cathode assembly 102.

Figure 4:
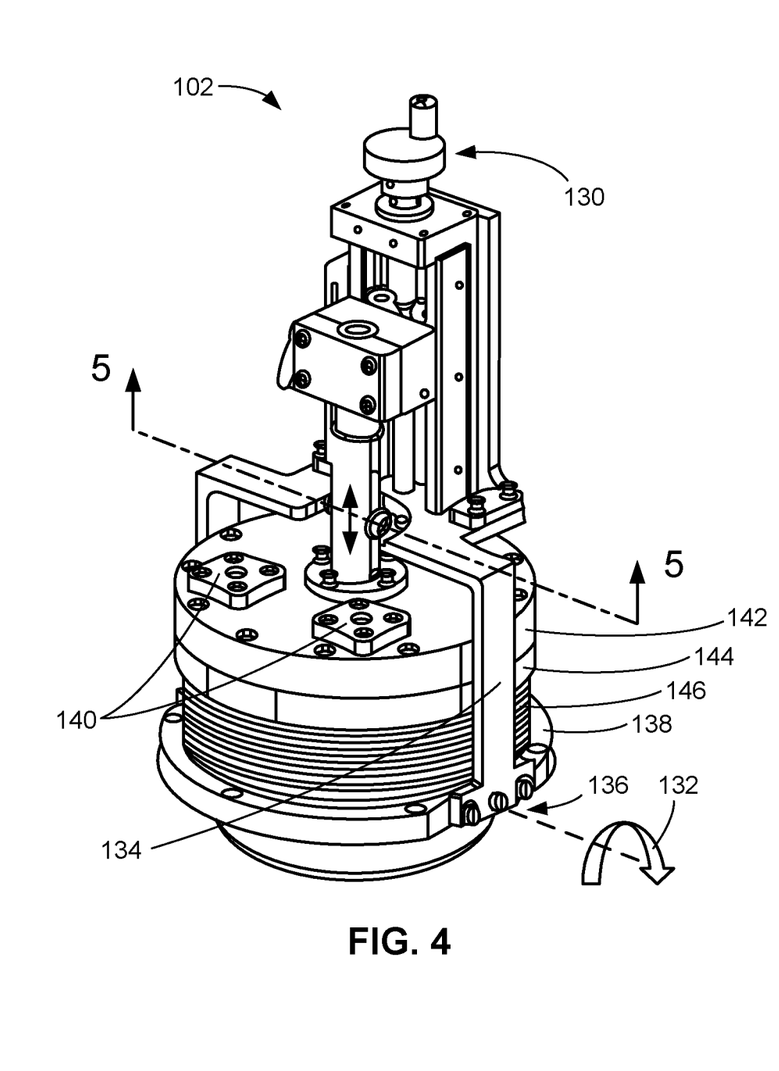
FIG. 4 is a top perspective view of one of the cathode assemblies of the deposition system of FIG. 1.

Referring now to FIG. 4, a top isometric view of one of the cathode assemblies 102 of the deposition system in the form of the multi-cathode PVD chamber 100 of FIG. 1 is shown. In some embodiments, an angular adjustment mechanism 132 provides an angular movement to change the angular positions of the cathode assemblies 102. The angular adjustment mechanism 132 provides the angular positions by rotating a swing arm 134 of each of the cathode assemblies 102 with respect to or based on a pivot point 136. The pivot point 136 is located at a bottom end of the swing arm 134 where the swing arm 134 is attached to a lower flange 138. Water adapter blocks 140 are mounted on a top plate 142. The top plate 142 is shown as over an upper flange 144, which together with the lower flange 138 provides upper and lower support structures for an outer bellow assembly 146.

Figure 5:
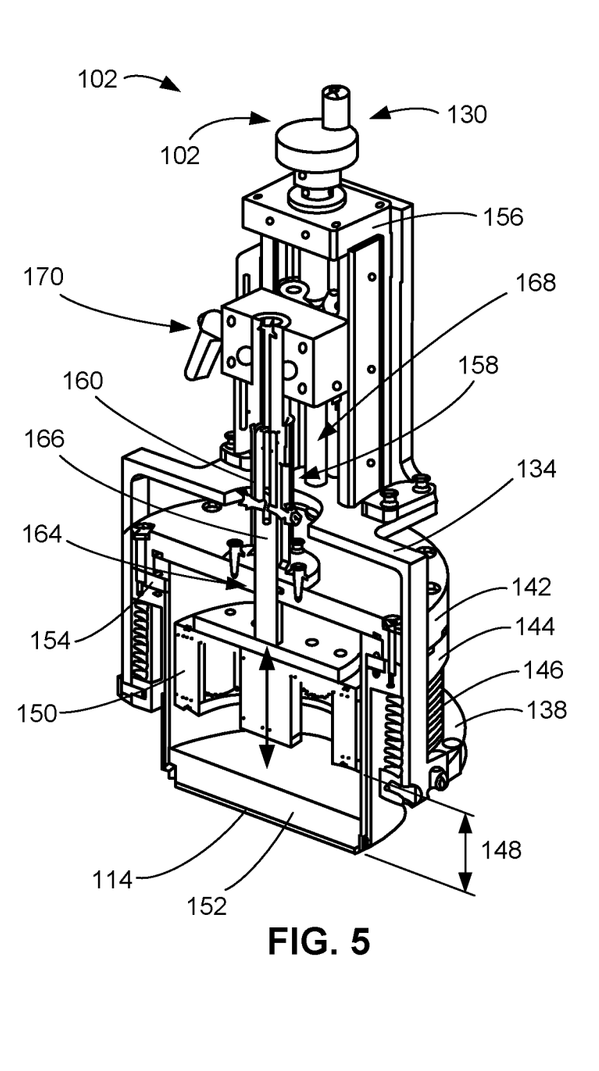
FIG. 5 is a cross-sectional view of one of the cathode assemblies taken along line 5-5 of FIG. 4.

FIG. 5 is a cross-sectional view of one of the cathode assemblies 102 taken along line 5-5 of FIG. 4. The cross-sectional view depicts an individual target source or one of the cathode assemblies 102. FIG. 5 depicts an assembly of one of the cathode assemblies 102, in which a magnet-to-target spacing 148 is adjusted during the deposition process. The magnet-to-target spacing 148 is a distance between a magnet 150 of one of the cathode assemblies 102 and one of the targets 114. The cathode assemblies 102 are adjusted manually or automatically. Each of the targets 114 is bonded or mounted to a backing plate 152, which is similar to a structure with a vessel shape, the outer bellow assembly 146 having the lower flange 138 and the upper flange 144. For example, both of the lower flange 138 and the upper flange 144 are welded with each other using flexible bellows with a conductive material including stainless steel (SST).

In some embodiments, each of the targets 114 is mounted inside the upper flange 144. A grounded shield is formed with the lower flange 138 and the upper flange 144 grounded. A nonconductive ring 154 helps to electrically isolate the grounded shield from the targets 114, which can be live due to connection with the power supply 112.

For example, the nonconductive ring 154 includes an insulation material, such as ceramic or clay. The grounded shield is a part that is mounted on the inside of the lower shield 118.

In some embodiments, the top plate 142 is bolted from a top surface of the top plate 142 to compress all O-rings including the nonconductive ring 154 to hold the targets 114 in place. As such, the vacuum as well as water leak sealing is achieved. Each source or each of the cathode assemblies 102 includes a number of manual motion mechanisms described below for improving the uniformity of the material layer 103. For example, the bolted plate includes insulation, such as a type of an insulator material similar to fiberglass.

In some embodiments, the manual motion mechanisms include the angular adjustment mechanism 132 using the swing arm 134 that pivots around the lower flange 138. The swing arm 134 holds a linear slide 156 over the swing arm 134 and at a top portion of each of the cathode assemblies 102. The swing arm 134 adjusts the targets 114 for +/−5 degrees with respect to the carrier 108. The manual motion mechanisms include a source lift mechanism 158 with the swing arm 134 holding the linear slide 156 at the top portion of each of the cathode assemblies 102. The linear slide 156 holds a source or the materials with a hollow shaft 160. The linear slide 156 provides a source movement of the materials along the hollow shaft 160 as shown by a bidirectional vertical arrow.

The manual motion mechanisms of some embodiments include a knob adjustment mechanism 162 with a manual adjustment knob or the knob 130 at the top portion of each of the cathode assemblies 102 to provide a linear actuation. The knob adjustment mechanism 162 is designed to achieve a total stroke length. The total stroke length includes any numerical value. For example, the total stroke length is 2.5 inches.

The manual motion mechanisms of some embodiments include a magnet-to-target adjustment mechanism 164 to adjust the magnet-to-target spacing 148. A permanent magnet is placed inside the source. An inner shaft 166 holds the magnet 150 inside the hollow shaft 160. The inner shaft 166 can include any structure for holding the magnet 150. As a specific example, the inner shaft 166 includes a Delrin® shaft.

An adjustment screw 168 on top of each of the cathode assemblies 102 provides a linear adjustment of the magnet-to-target spacing 148. A side locking screw 170 holds the magnet 150 in position after achieving a predetermined value of the magnet-to-target spacing 148. For example, a total adjustable stroke length for the magnet-to-target spacing 148 is 1 inch.

Referring now to FIGS. 6-9, an alternative embodiment of a deposition system according to an embodiment of the disclosure is shown. Similar to the embodiment shown in FIG. 1, the deposition system in the form of a PVD chamber is a multi-cathode PVD chamber 200 including a plurality of cathode assemblies 202. The multi-cathode PVD chamber 200 includes a multi-target PVD source configured to manufacture an MRAM (magnetoresistive random access memory) or a multi-target PVD source configured to manufacture an extreme ultraviolet (EUV) mask blank.

Figure 6:
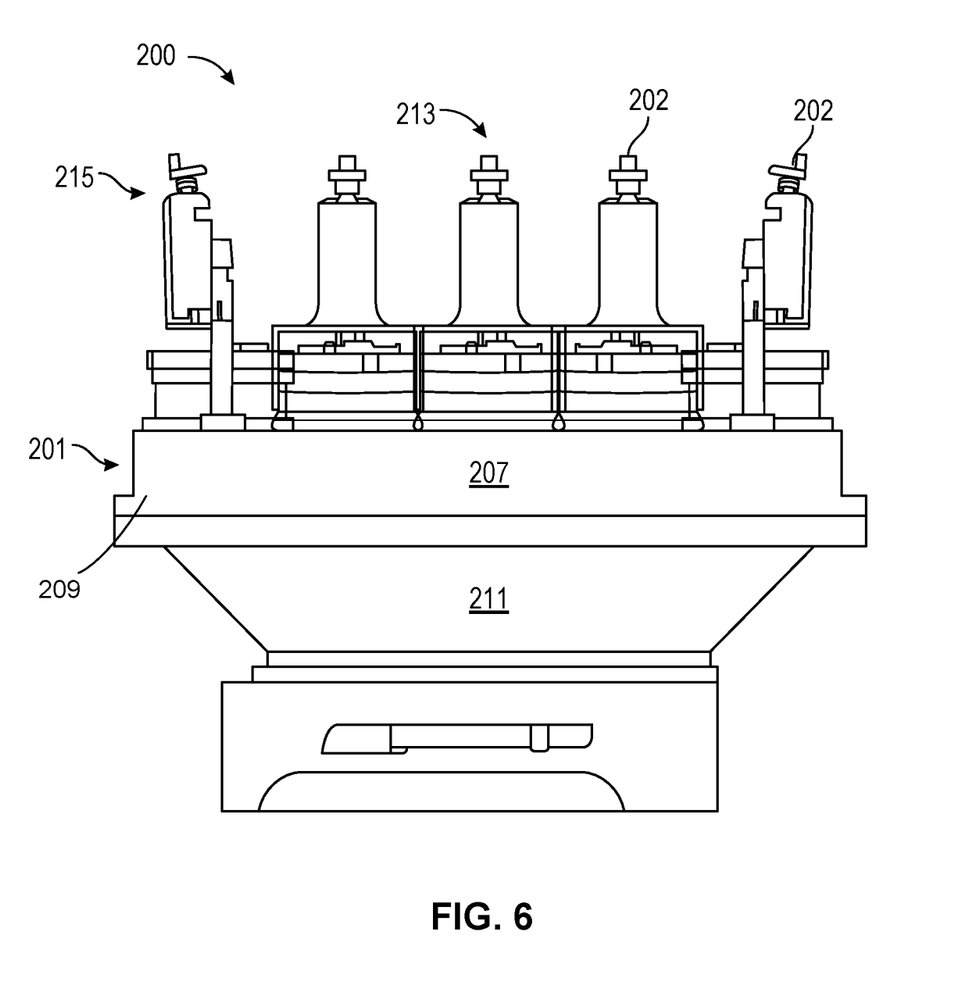
FIG. 6 is a side view of a deposition system according to an embodiment of the disclosure.
Figure 7:
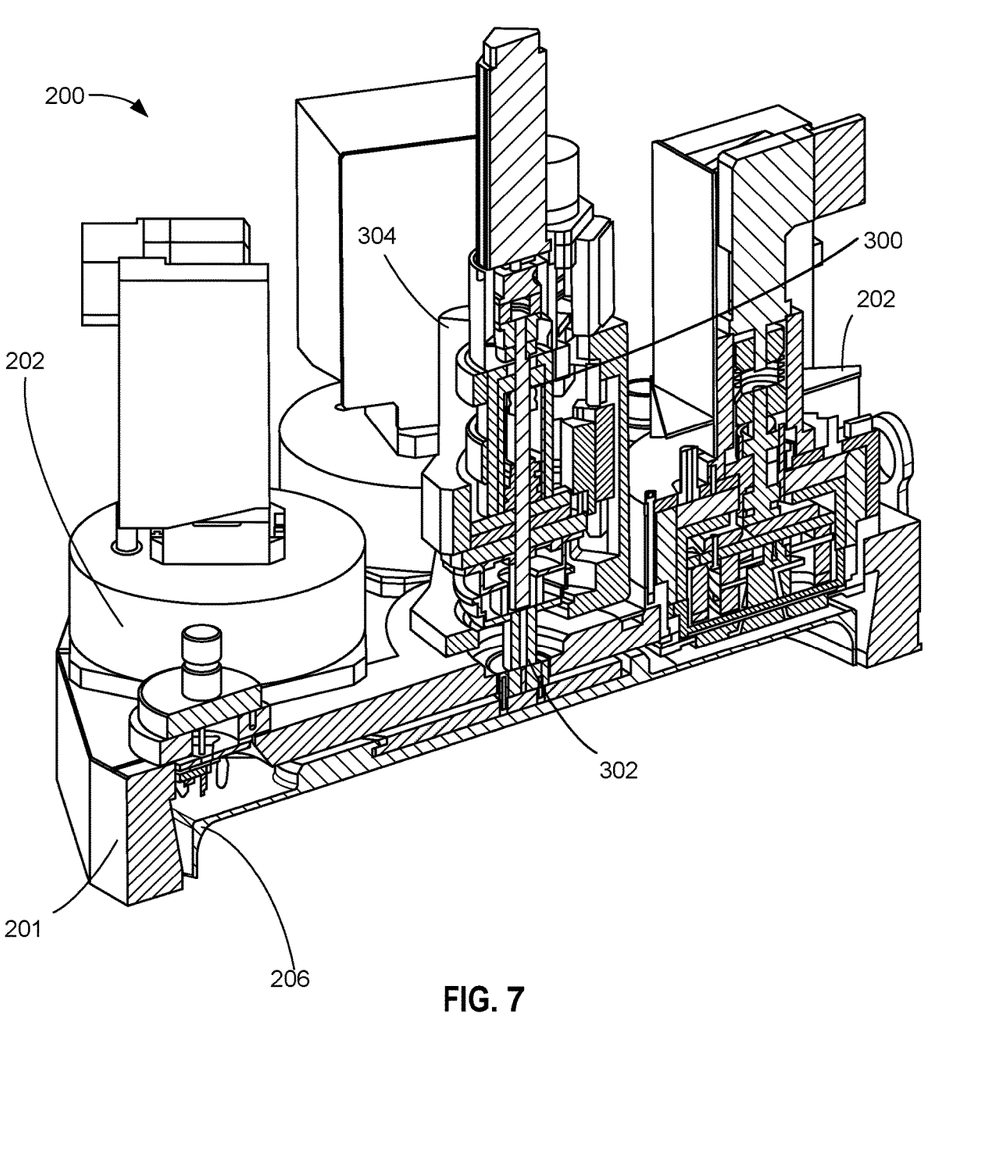
FIG. 7 is a cross-sectional view of a portion of a deposition system according to an embodiment of the disclosure.

The multi-cathode PVD chamber 200 comprises a chamber body 201, comprising a source adapter 207 configured to hold multiple cathode assemblies 102 in place in a spaced apart relationship. As can be seen in FIGS. 6 and 7, the chamber body 201 is shown as being generally cylindrical and having the source adapter 207 having a dome portion 209 flatter than the dome 109 of the multi-cathode PVD chamber 100 shown in FIG. 1. The source adapter 207 holds any number of the cathode assemblies 202. As a specific example, the source adapter 207 supports twelve cathode assemblies 202. However, in some embodiments, the source adapter 207 supports one, two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four or twenty-five cathode assemblies 202.

The source adapter 207 is mounted onto a base adapter 211, which can be conical, cylindrical or any other shape such as square or rectangular. Both the source adapter 207 and the base adapter 211 enclose an inner volume, which is an area where a substrate or carrier 108 is processed according to one or more embodiments.

The multi-cathode PVD chamber 200 includes multiple cathode assemblies 202 for PVD and sputtering. Each of the cathode assemblies 202 is connected to a power supply (not shown) including direct current (DC) or radio frequency (RF). The cathode assemblies 202 can have any number of different diameters. In some embodiments, the cathode assemblies 202 all have the same diameter. In other embodiments, the cathode assemblies 202 have two, three, four, five, six or more different diameters. Similar to the embodiment shown in FIGS. 1 and 2, the cathode assemblies 202 are arranged in an inner ring 213 and an outer ring 215. All of the cathode assemblies 202 are arranged in a single ring instead of inner and outer rings.

Figure 8:
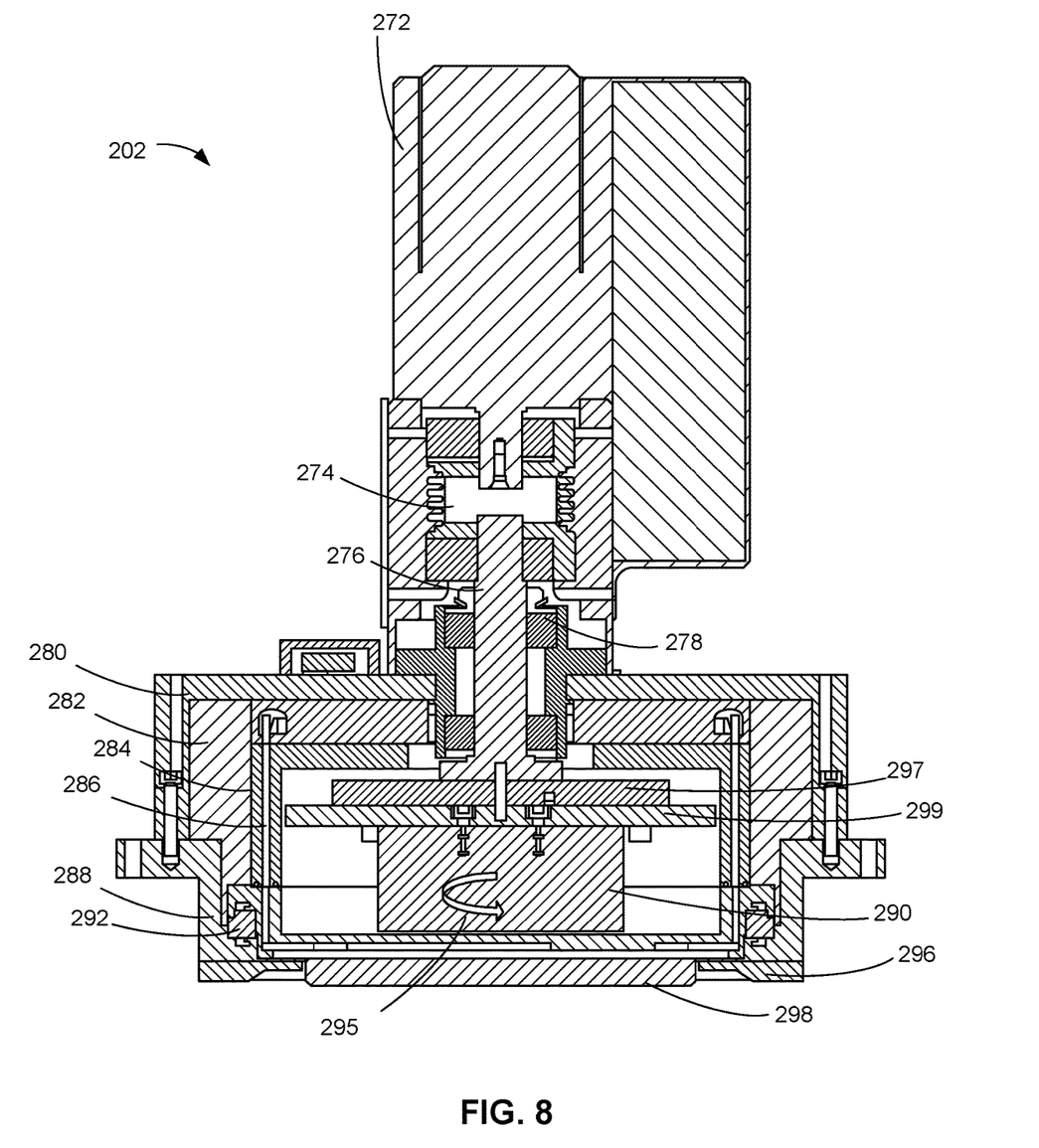
FIG. 8 is cross-sectional view of one of the cathode assemblies shown in FIG. 7.

FIG. 7 is a cross-sectional view of a portion of a multi-cathode PVD chamber according to an embodiment of the disclosure showing cathode assemblies 202, chamber body 201 and shield 206. The shield 206 is connected to a shield motor shaft 300 by collet 302, and the shield motor shaft 300 is rotated by a shield motor assembly 304. FIG. 8 is cross-sectional view of one of the cathode assemblies 202 shown in FIG. 7. The cathode assembly 202 shown in FIG. 8 according to one or more embodiments comprises a motor 272, which drives a motor shaft 276 that rotates a magnet assembly 290 in the direction shown by arrow 295. A coupler 274 couples the motor 272 to the motor shaft 276. Bearings 278 surround the motor shaft to facilitate rotational motion in the direction of arrow 295. The cathode assembly 202 further comprises an upper housing 280 and a lower housing 288 surrounding an insulator 282, which surrounds a conductor 284 including a coolant channel 286 therethrough to cool the cathode assembly 202 during processing. The upper housing 280 and the lower housing 288 may be assembled together using any suitable fasteners or fastening system such as machine screws or bolts. The cathode further comprises an insulator ring 292 and an O-ring 294 at a base of the conductor 284. Deposition barrier 296 is provided at the bottom of the cathode assembly 202. Assembled to the motor shaft 276 are an insulator plate 297 and a mounting plate 299 for securing the magnet assembly to the motor shaft 276. A target 298 comprising material to be sputtered (e.g., silicon or molybdenum, etc.) is at the bottom of the cathode assembly 202.

According to embodiments of the present disclosure, a shield mounting assembly 305 is provided for a rotating shield 206 in a multi-cathode chamber, the shield mounting assembly 305 providing reduced vibrations and a secure way of mounting the shield 206.

Figures 9A, 9B:
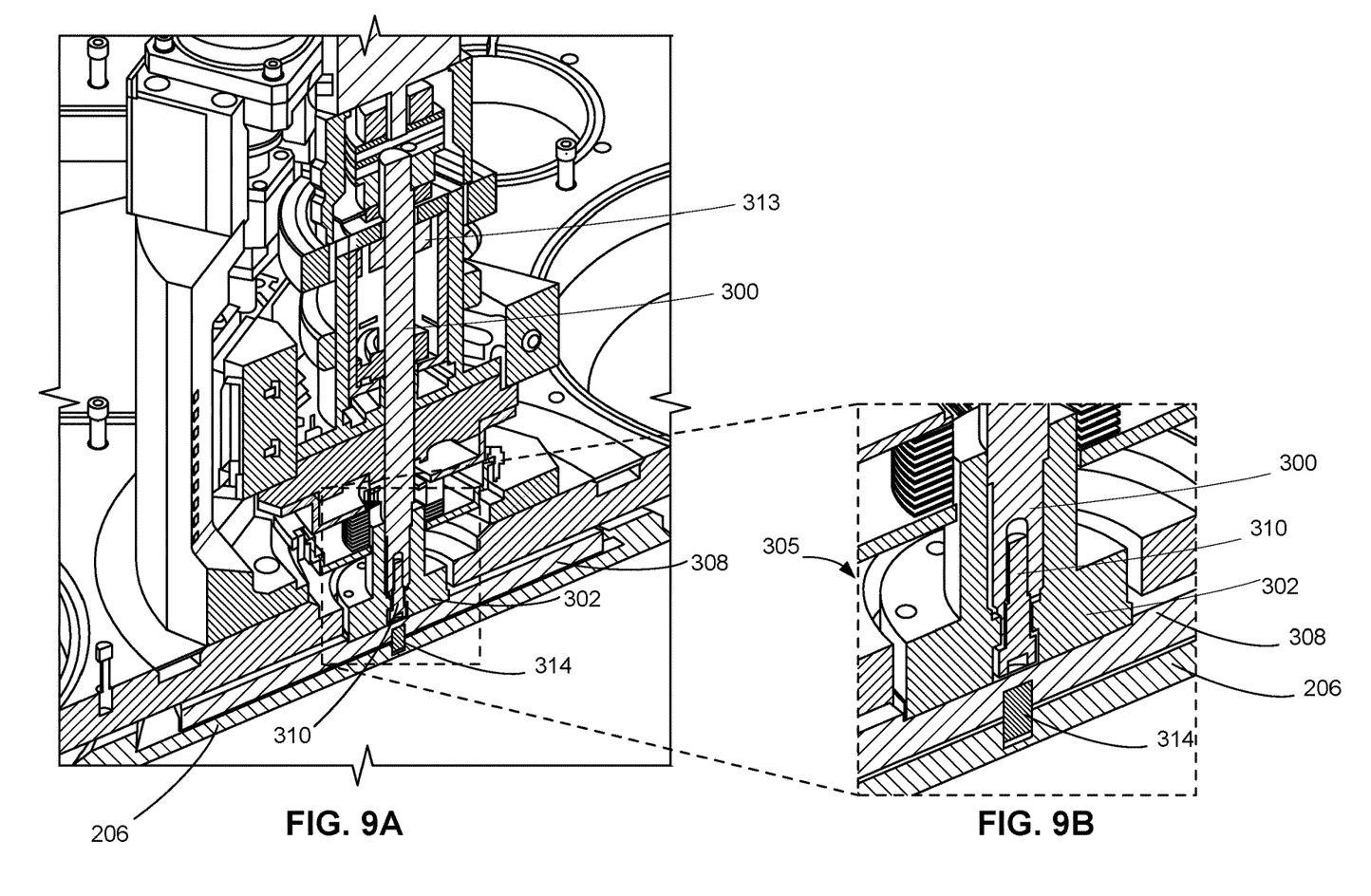
FIG. 9A is a partial cross-sectional view showing a shield mounting assembly according to one or more embodiments.
FIG. 9B is an enlarged partial perspective view of a collet and centering assembly according to one or more embodiments.

FIG. 9A is a partial cross-sectional view showing a shield mounting assembly 305 according to one or more embodiments, and FIG. 9B is an enlarged partial perspective view of a portions of the shield mounting assembly 305. The shield mounting assembly 305 includes a collet 302, which is fastened to a shield motor shaft 300 and the shield 206 by shield mount 308. In one embodiment, a ferrofluidic feedthrough 313 or magnetically coupled rotational feedthrough is provided to engage the motor shaft and pass rotational motion of the shield motor shaft 300 to the shield 206.

Figure 14:
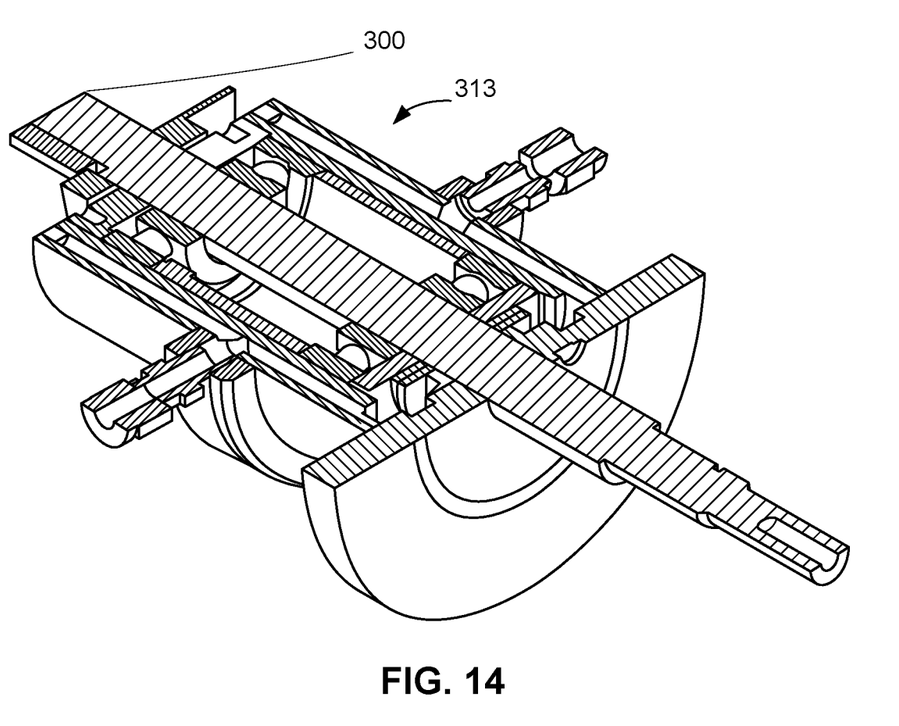
FIG. 14 is an enlarged cross-sectional view of a motor shaft and a ferrofluidic interface according to one or more embodiments.

According to one or more embodiments, the ferrofluidic feedthrough is advantageous because the ferrofluidic feedthrough 313 is a straight, direct drive that does not exhibit lag like a magnetic coupling for rotation of a large, bulky shield. FIG. 14 shows a cross-section view of an example of a ferrofluidic feedthrough according to one or more embodiments. In some embodiments, the shaft of the ferrofluidic feedthrough 313 is always perpendicular to the flange 313a, which eliminates offset and wobble. Furthermore, in some embodiments, the ferrofluidic feedthrough 313 eliminates exposure of foreign particles (e.g., grease) inside the PVD chamber under high vacuum. In some embodiments, the ferrofluidic feedthrough 313 uses the response of a magnetic fluid with an applied magnetic field. Rotary seal components include a ferrofluid, a permanent magnet, two pole pieces and a magnetically permeable shaft. A magnetic circuit employs stationary pole pieces and the rotating shaft and concentrates magnetic flux in the radial gap under each pole piece. When the ferrofluid is applied to this radial gap, it takes the shape of a liquid O-ring and produces a hermetic vacuum seal.

A tapered centering shaft 310 engages the collet 302 and the shield motor shaft 300. A dowel 314 centers the shield 206 and the shield mount 308. The tapered centering shaft 310 and the dowel 314 cooperate to center the shield mount 308 and the shield 206.

Figure 10:
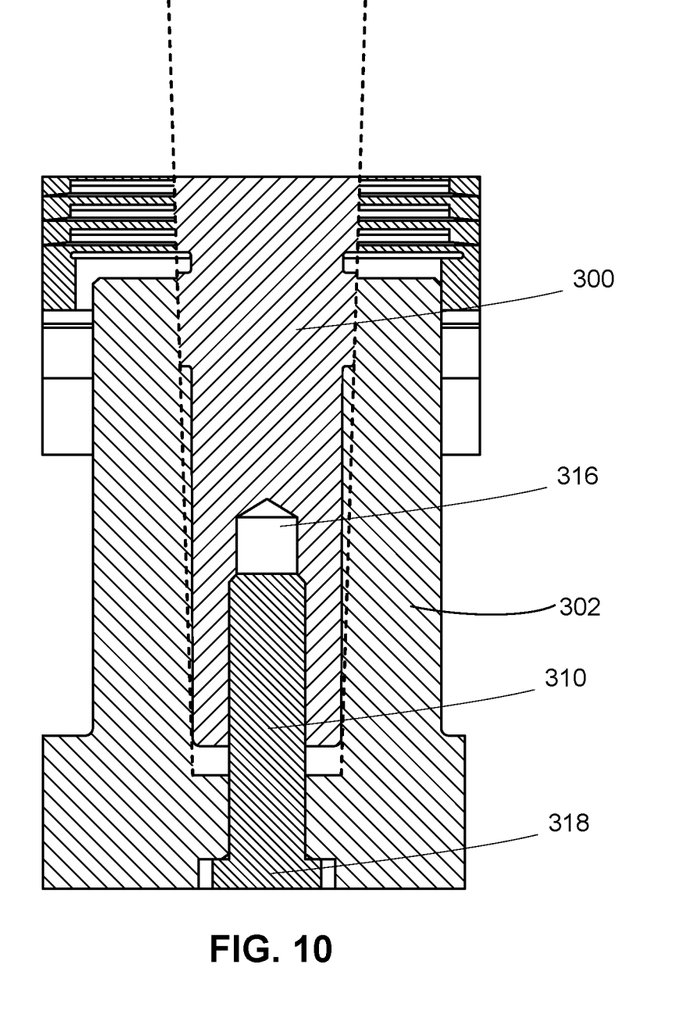
FIG. 10 is an enlarged cross-sectional view of a self-centering shaft according to one or more embodiments.

FIG. 10 is an enlarged cross-sectional view of the tapered centering shaft 310 according to one or more embodiments. The tapered centering shaft 310 has a tapered tip 316 that engages the shield motor shaft 300 and has a flared head 318 to secure the collet 302 to the shield motor shaft 300.

Figure 11:
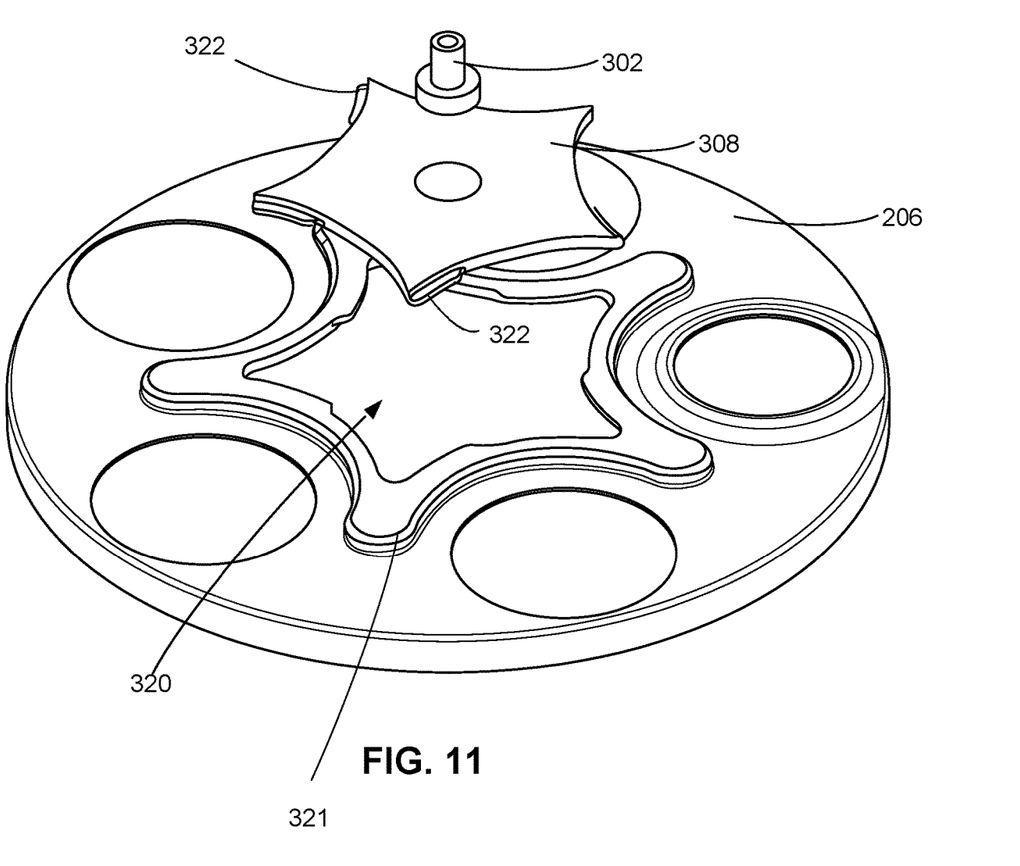
FIG. 11 is an exploded top perspective view of a shield and a portion of a shield mounting assembly according to one or more embodiments.
Figure 12:
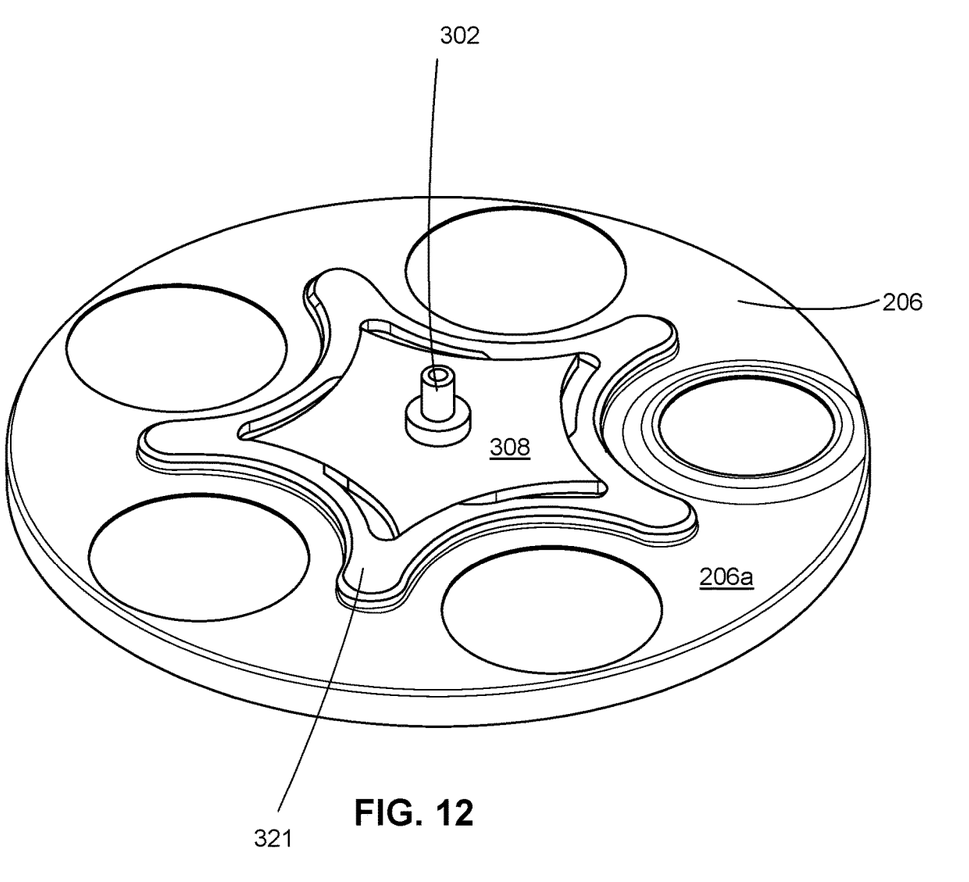
FIG. 12 is an assembled top perspective view of a shield and a portion of the shield mounting assembly according to one or more embodiments
Figure 13:
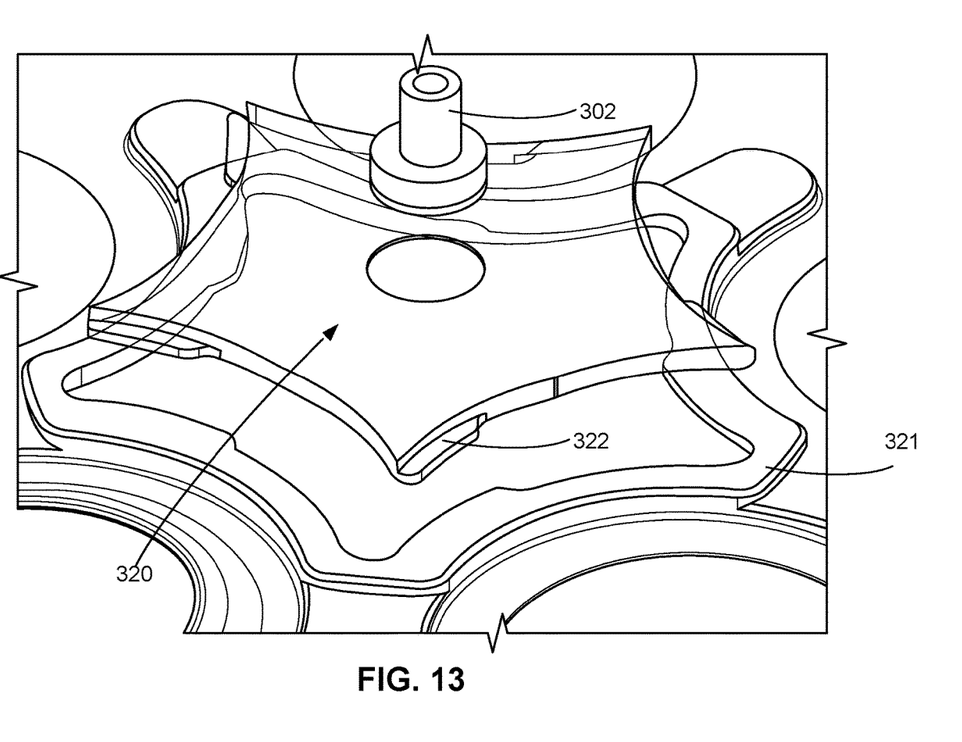
FIG. 13 is an enlarged top perspective view of a portion of the shield mounting assembly and the shield according to one or more embodiments.

Referring now to FIG. 11 an exploded top perspective view of a shield 206 and a shield mount 308 according to one or more embodiments is shown. FIG. 12 shows an assembled top perspective view of a shield and a shield mount according to one or more embodiments. FIG. 13 shows an enlarged top perspective view of a portion of the mounting assembly and the shield according to one or more embodiments. Referring to FIGS. 11-13, the top surface 206a of the shield 206 includes a receiving pocket 320 shaped to receive the shield mount 308. Shield mount 308 and receiving pocket 320 are complementarily shaped, or, in other words have complementary geometric shapes. Stated another way, the shield mound defines a geometric shape that is received within a pocket of the shield to secure the shield mount to the shield. In the embodiment shown, the receiving pocket 320 and the shield mount 308 are star-shaped or in the shape of a pentagon having concave sides. The shape of the receiving pocket 320 and the shield mount are exemplary, and it will be understood that other complementarily shaped shield mount 308 and receiving pocket 320 combinations are possible, such as triangular, square, trapezoidal, rectangular, etc.

The receiving pocket 320 comprises a raised peripheral frame 321 defining the receiving pocket 320. The shield mount 308 has edge projections 322 that are configured to be received under the raised peripheral frame 321. FIG. 12 shows the shield mount 308 fitted within the recess with the edge projections 322 engaged with the peripheral frame to secure or lock the shield mount 308 to the shield 206.

One or more embodiments described herein are particularly useful in multi-cathode PVD systems with rotating magnets. The target assemblies described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer are formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layers of, for example, molybdenum and silicon are formed by physical vapor deposition, for example, in a multi-cathode PVD chamber.

A first embodiment of the disclosure pertains to a physical vapor deposition (PVD) chamber comprising a plurality of cathode assemblies; a rotating shield below the plurality of cathode assemblies to expose one of the plurality of cathode assemblies through a shield hole of the rotating shield, the rotating shield comprising a top surface including a raised peripheral frame; and a shield mount sized and shaped to engage with the raised peripheral frame to secure the shield mount to the shield.

In a second embodiment, the PVD chamber of the first embodiment further comprises a target below each of the plurality of cathode assemblies; and a rotating pedestal carrier.

In a third embodiment, the first and second embodiment include the feature that the raised peripheral frame defines a pocket having a geometric shape that is complementary and the shield mount has a geometric shape that is complementary to the geometric shape of the pocket. In a fourth embodiment, the geometric shape of the pocket is a polygon. In a fifth embodiment, the geometric shape of the pocket is a pentagon. In a sixth embodiment, the geometric shape of the pocket is a pentagon with concave sides.

In a seventh embodiment, in any of the first through sixth embodiments, the shield mount comprises edge projections that are received by the raised peripheral frame. In an eighth embodiment, the PVD chamber of the first through seventh embodiments further comprises a collet secured to the shield mount and a shield motor shaft secured to the collet. In ninth embodiment, the shield motor shaft is engaged with a ferrofluidic feedthrough and a shield motor.

In a tenth embodiment, a physical vapor deposition (PVD) chamber comprises a plurality of cathode assemblies; a rotating shield below the plurality of cathode assemblies to expose one of the plurality cathode assemblies through a shield hole of the rotating shield, the rotating shield comprising a top surface including a raised peripheral frame; a shield mount sized and shaped to engage with the raised peripheral frame to secure the shield mount to the shield; a collet secured to the shield mount; and a shield motor shaft secured to the collet and secured to a motor that rotates the shield motor shaft and the shield.

In an eleventh embodiment, the PVD chamber of the tenth embodiment further comprises a ferrofluidic feedthrough engaged with the shield motor shaft to pass rotational motion of the shield motor shaft to the shield. In a twelfth embodiment, the tenth embodiment further comprises a tapered centering shaft engaging the collet and the shield motor shaft. In a thirteenth embodiment, the tenth embodiment includes a feature wherein the shield mount has a geometric shape that engages a peripheral frame on a top surface of the shield to secure the shield mount to the shield.

A fourteenth embodiment pertains to method of depositing a material layer comprising placing a substrate in a PVD chamber comprising a plurality of cathode assemblies; rotating a shield below the plurality of cathode assemblies to expose one of the plurality cathode assemblies through a shield hole of the shield, the shield comprising a top surface including a raised peripheral frame, the shield secured to a shield mount sized and shaped to engage with the raised peripheral frame on the shield to secure the shield mount to the shield; and depositing the material layer on the substrate. In a fifteenth embodiment of the method, the shield mount comprises a geometric shape that fits within a pocket defined by the raised peripheral frame. In a sixteenth embodiment of the method, the shield mount is in the shape of a pentagon. In any of the method embodiments, the substrate comprises an extreme ultraviolet mask blank. In such method embodiments, depositing multiple alternating materials layers comprises a first layer comprising molybdenum and a second layer comprising silicon.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition (PVD) chamber comprising:
    a plurality of cathode assemblies positioned over a plurality of targets and configured to deposit material on a substrate positioned below the plurality of targets;
    a rotating shield positioned below the plurality of cathode assemblies and the plurality of targets, the rotating shield including a shield hole configured to expose one of the plurality of targets through the shield hole, the rotating shield comprising a top surface and a raised peripheral frame extending from the top surface and defining a receiving pocket;
    a shield motor coupled to a shield motor shaft coupled to a collet; and
    a shield mount sized and shaped to engage with the raised peripheral frame to lock an edge of the shield mount to the shield within the receiving pocket, wherein the collet is fastened to the shield mount.

2. The PVD chamber of claim 1, further comprising:
    a rotating pedestal configured to support at least one of a carrier and the substrate.

3. The PVD chamber of claim 1, wherein the receiving pocket has a geometric shape and the shield mount has a geometric shape that is complementary to the geometric shape of the receiving pocket.

4. The PVD chamber of claim 3, wherein the geometric shape of the receiving pocket is a polygon.

5. The PVD chamber of claim 4, wherein the geometric shape of the receiving pocket is a pentagon.

6. The PVD chamber of claim 4, wherein the geometric shape of the receiving pocket is a pentagon with concave sides.

7. The PVD chamber of claim 1, wherein the shield mount comprises edge projections that are received by the raised peripheral frame.

8. The PVD chamber of claim 7, where the shield mount is in a shape of a polygon.

9. The PVD chamber of claim 8, wherein the shield mount is in a shape of a pentagon.

10. The PVD chamber of claim 1 wherein the collet comprises a tapered centering shaft that engages the shield motor shaft to secure the collet to the shield motor shaft, and the collet is centered with the motor shaft, the shield and the shield mount, and rotation of the shield motor shaft causes rotation of the collet, the shield mount and the shield.

11. The PVD chamber of claim 10, wherein the shield motor shaft is engaged with a ferrofluidic feedthrough and a shield motor.

12. A physical vapor deposition (PVD) chamber comprising:
    a plurality of cathode assemblies positioned over a plurality of targets and configured to deposit material on a substrate positioned below the plurality of targets;
    a rotating shield positioned below the plurality of cathode assemblies and the plurality of targets, the rotating shield including a shield hole configured to expose one of the plurality of targets through the shield hole, the rotating shield comprising a top surface including a raised peripheral frame extending from the top surface and defining a receiving pocket;
    a shield mount sized and shaped to engage with the raised peripheral frame and the receiving pocket to secure and lock the shield mount to the shield;
    a collet secured to the shield mount; and
    a shield motor shaft secured to the collet and secured to a shield motor that rotates the shield motor shaft and the shield.

13. The PVD chamber of claim 12, further comprising a ferrofluidic feedthrough engaged with the shield motor shaft to pass rotational motion of the shield motor shaft to the shield.

14. The PVD chamber of claim 12, further comprising a tapered centering shaft engaging the collet and the shield motor shaft.

15. The PVD chamber of claim 12, wherein the shield mount has a geometric shape that engages a peripheral frame on a top surface of the shield to secure the shield mount to the shield.

16. A method of depositing a material layer comprising:
    placing a substrate in a PVD chamber comprising a plurality of cathode assemblies;

rotating a shield below the plurality of cathode assemblies to expose one of the plurality of cathode assemblies through a shield hole of the shield, a shield mount comprising a top surface including a raised peripheral frame extending from the top surface and defining a receiving pocket, the shield secured to the shield mount sized and shaped to engage with the raised peripheral frame and the receiving pocket to secure and lock the shield mount to the shield; and depositing the material layer on the substrate.

17. The method of claim 16, wherein the shield mount comprises a geometric shape that fits within the receiving pocket.

18. The method of claim 17, wherein the shield mount is in the shape of a pentagon.

19. The method of claim 18, wherein the substrate comprises an extreme ultraviolet mask blank.

20. The method of claim 19, further comprising depositing multiple alternating material layers comprising a first layer comprising molybdenum and a second layer comprising silicon.

* * * * *